United States Patent [19]

Plonski

[11] Patent Number: 4,679,321
[45] Date of Patent: Jul. 14, 1987

[54] METHOD FOR MAKING COAXIAL INTERCONNECTION BOARDS

[75] Inventor: J. Philip Plonski, Huntington, N.Y.

[73] Assignee: Kollmorgen Technologies Corporation, Dallas, Tex.

[21] Appl. No.: 788,962

[22] Filed: Oct. 18, 1985

[51] Int. Cl.$^4$ .............................................. H01K 3/10
[52] U.S. Cl. .................................... 29/850; 174/68.5; 228/56.3
[58] Field of Search ................. 29/846, 850; 174/68.5; 228/56.3

[56] References Cited

U.S. PATENT DOCUMENTS 3,659,340 5/1972 Gledd et al. .......................... 29/850
3,969,816 7/1976 Swengel, Sr. et al. ............... 29/879
3,996,416 12/1976 Lemke ................................. 174/68.5

Primary Examiner—Howard N. Goldberg
Assistant Examiner—Carl J. Arbes

[57] ABSTRACT

An interconnection board for high frequency signals is made by wire scribing coaxial conductors. The board is provided with holes. The coaxial conductors with signal conductor surrounded by a dielectric in turn surrounded by a conductive shield are wire scribed on a first surface of the board. The ends of the coaxial conductors are stripped to expose signal conductor sections, and dielectric sections. The stripped ends are inserted through the holes so that the dielectric sections reside in the holes and the exposed signal conductors protrude through the holes on the second surface of the board. The signal conductors are terminated on the second surface, and the conductive shields are connected together on the first surface.

7 Claims, 11 Drawing Figures

METHOD FOR MAKING COAXIAL INTERCONNECTION BOARDS

BACKGROUND OF THE INVENTION

This invention relates to a wire scribed circuit board product and method of manufacture. Specifically this invention relates to wire scribed circuit boards wherein at least some of the conductors are coaxial conductors.

Coaxial conductors are the preferred transmission medium for high frequency signals, particularly high speed digital signals, in which the signal conductor is protected by a shield which is electrically connected to the reference potential or "ground". A coaxial conductor contains all of the signal energy inside its shield on the signal conductor. The shield isolates the signal conductor from the surrounding environment, thus providing a clean uniform environment for signal travel. The shield prevents radiation of energy from the signal conductor which improves signal propagation and reduces electrical interference which may affect other signals in the vicinity.

Although coaxial conductors are recognized as a preferred interconnect medium for high speed signals, they are not widely used in electrical circuit boards because of the problems incurred in properly terminating the ends of the coaxial conductor. The signal conductor and shield must be electrically isolated from each other at the terminal points. In manual installations, the signal conductor is usually terminated by stripping back or removing the shield and insulation and then connecting to the terminal point by soldering, welding, or the like. Termination of the shield is conventionally made by connecting a wire, often called a drain wire, between the shield and a central ground point. This approach, however, is not practical in automatically produced interconnection boards or where there are a large number of interconnections.

Wire scribed circuit boards can be produced automatically using the method described in U.S. Pat. Nos. 3,671,914 and 3,674,102. In this process an insulated wire is scribed onto an insulating base by feeding a continuous strand of wire onto the surface of the base while simultaneously affixing the wire to the base thereby producing a wire image of a predetermined interconnect pattern. Through holes are subsequently drilled at the terminal points intersecting the end points of the conductors. The holes are then metallized to electrically connect the ends of the conductors to surface terminal pads or later added components.

The above cited patents describing methods for manufacture of discrete wire circuit boards broadly describe a method for adhering insulated wire to an insulating base or substrate and for making terminations at the ends of the conductors. The process, however, does not work if coaxial conductors are used as the interconnect medium since the signal conductor and shield would become electrically connected or "shorted" at the terminal points.

In U.S. Pat. No. 3,969,816 "Bonded Wire Interconnection System" by Swengel et al, discrete coaxial conductors are placed at locations on a substrate. Lengths of coaxial conductors are bridged between discrete point locations determined by a matrix apertured substrate. The conductors are anchored within the substrate apertures and the ends then milled flush with the board surface to expose the shield and signal conductor. In order to prevent shorting of the signal conductor to the shield, a ring of dielectric material is placed on the surface, covering the shield end. In another embodiment a selective etch (apparently a photo resist with selective activation) is used to recess the shield from the surface plane. The patent also discloses terminal points interconnected by insulated conductors which are metallized to create a shield for the conductors. The conductor termination techniques disclosed in the U.S. Pat. No. 3,969,816 are all based on having conductor terminations flush with the board surface.

SUMMARY OF THE INVENTION

Coaxial circuit boards are made according to the invention using non-metalized holes at the terminal points. The circuit board is constructed having one side provided with a ground plane and having the other side provided with terminal pads and interconnection conductors. Holes are drilled through the board at the terminal points. The ends of the scribed coaxial conductors are step-stripped to expose a length of bare signal conductor followed by a bare insulation section. The ends of the coaxial conductor are then inserted so that the bare insulation sections fill the holes. The bare signal conductor emerges from one side of the board and is connected to the terminal pads whereas the shielded coaxial conductor resides on the other side.

Since the coaxial conductor shields are all on one side of the board which does not include any signal conductor terminations, the shields can be interconnected by applying a plated copper layer or a conductive encapsulating layer or by reflow soldering.

DETAILED DESCRIPTION OF THE INVENTION

FIGS. 1A to 1E illustrate the sequential steps used in creating a coaxial circuit board according to one embodiment of the invention. The ends of the coaxial conductors are step-stripped and inserted through holes in the board so that the shields are on one side of the board and the exposed signal conductors are on the other side of the board. By stripping back the coaxial conductors and locating the shields and exposed signal conductors on opposite sides, a clearance area is provided which permits termination of the signal conductors without creating an electrical short to the shield. With this arrangement the shield can then be interconnected using a common ground plane.

Figure 1A:
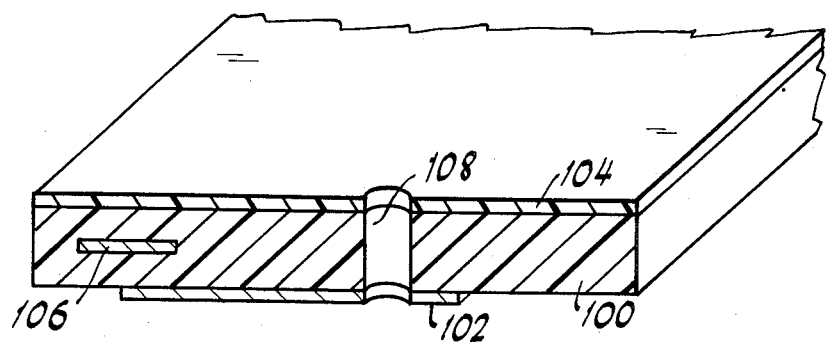
FIGS. 1A through 1E are a series of sequential illustrations showing the process according to the invention for making coaxial interconnection boards wherein the coaxial conductors are step-stripped and inserted through holes so that the conductive shields are on one side of the board and the exposed signal conductors are on the other.

The initial board is shown in FIG. 1A including a substrate 100 with signal conductors on one surface including a terminal pad 102. The other side of the board is coated with an activatable adhesive 104. In addition the board may contain internal conductors such as conductor 106, as well as ground planes and power planes. Holes 108 (which are not metallized) are drilled through the board at the terminal points in the area of the terminal pads.

A coaxial conductor 110 is prepared as shown in FIG. 4B by step-stripping the end. The shield 112 of the coaxial conductor is stripped to expose the dielectric insulation 114 and then the end portion of the exposed insulation is further stripped to expose a section of signal conductor 116. The length of the exposed insulation section 114 is approximately equal to the thickness of the board.

The step stripping can be accomplished mechanically using notched knife blades. One such knife blade would be dimensioned with a notch which accommodates the insulation 114 and is used to strip the shield from the end of the coaxial conductor. Another such knife blade would be dimensioned with a notch which accommodates the signal conductor and is used to strip insulation 114 from the signal conductor in the area where shield material has previously been removed. Alternatively, other known stripping techniques can be used such as grinding, abrading, chemical removal and laser vaporization.

Figures 1B, 1C:
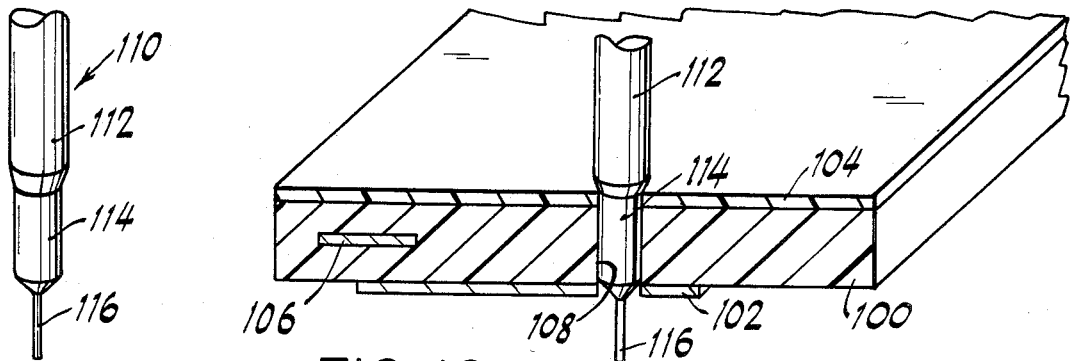

As shown in FIG. 1C, the stripped coaxial conductor end is inserted in hole 108 so that the exposed insulation section 114 fills the hole with the bare signal conductor 116 extending from one side of the board (the side including terminal pad 102) and the shield 112 extends from the other side of the board.

Figure 1D:
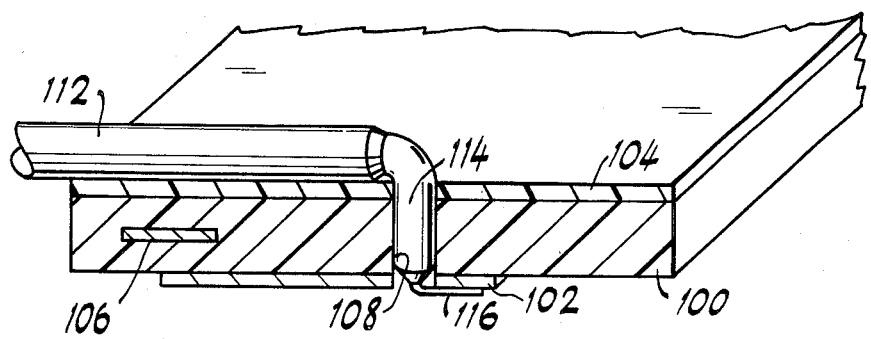
Figure 1E:
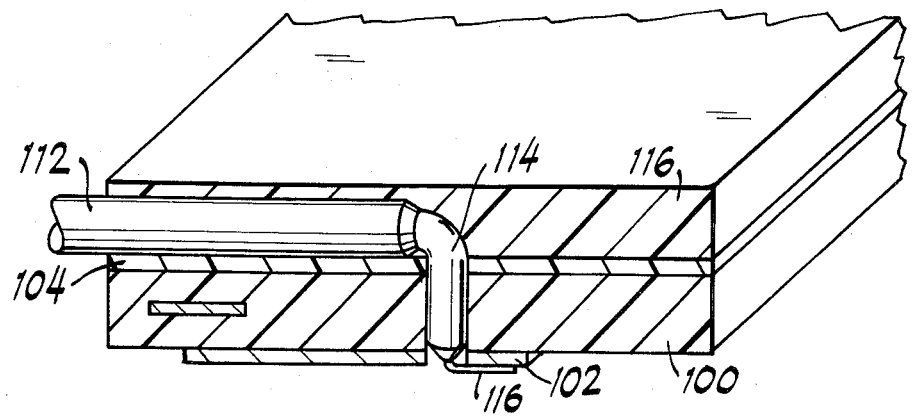

The coaxial conductor is then tacked in place in the adhesive coating 104 as shown in FIG. 1D. This can be accomplished using the general method disclosed in the Burr U.S. Pat. Pat. No. 3,671,914 where the board is mounted on an X-Y table and the coaxial wire dispensed from a scribing head. Adhesive layer 104 is activated along the conductor path by applying energy locally, such as ultrasonic energy, to activate the adhesive. After the conductor run has been tacked in place the other end of the coaxial conductor is similarly step-stripped and inserted through a terminal hole so that only the bare signal conductor extends from the other side of the board.

The bare signal conductors 116 can be bent over and soldered to terminal pad 102 as shown in FIG. 1D or can be connected by floating the board in a solder bath to interconnect the signal conductors and terminal pads.

Thereafter the board is encapsulated with a conductive epoxy resin 116 to form a ground plane interconnecting all of the conductive shields. A suitable material is EPO-TEK 17 from Epoxy Technology, Inc. which is epoxy filled with silver flakes (4 parts metal to 1 part epoxy). Alternatively, the surface of the board can be plated with a copper layer to provide interconnection and a ground plane. A copper plated board may then be encapsulated with a nonconductive resin if desired.

Figure 2A:
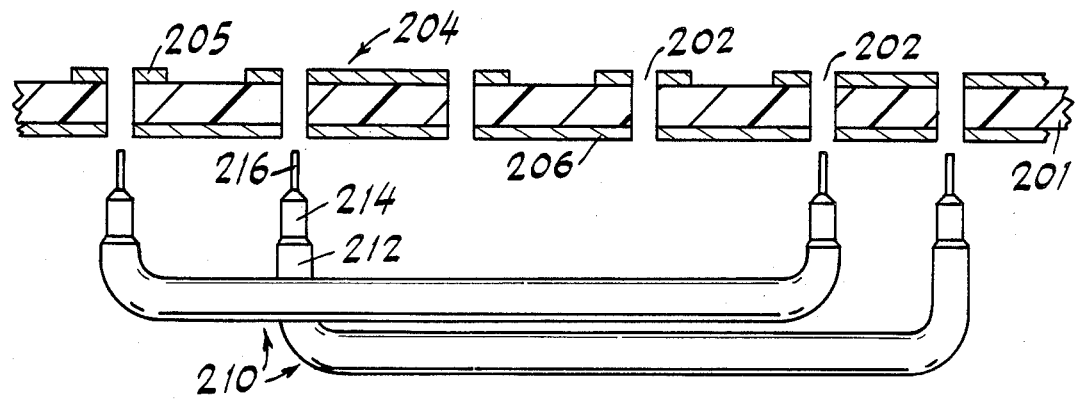
FIGS. 2A through 2C illustrate a variation of the process.
Figure 2B:
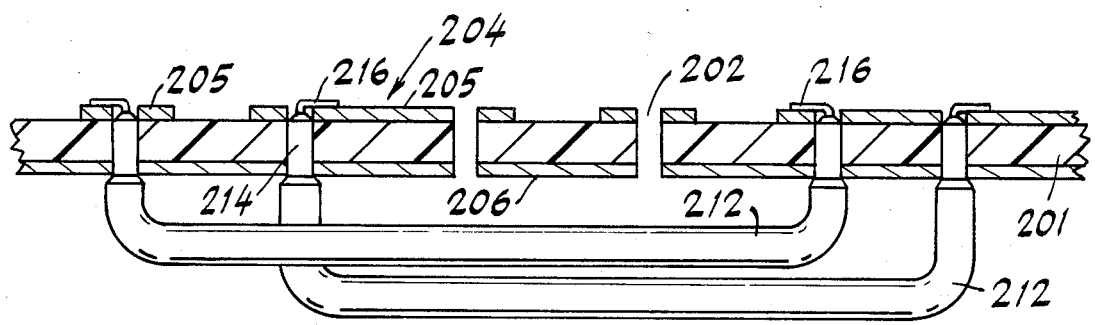
Figure 2C:
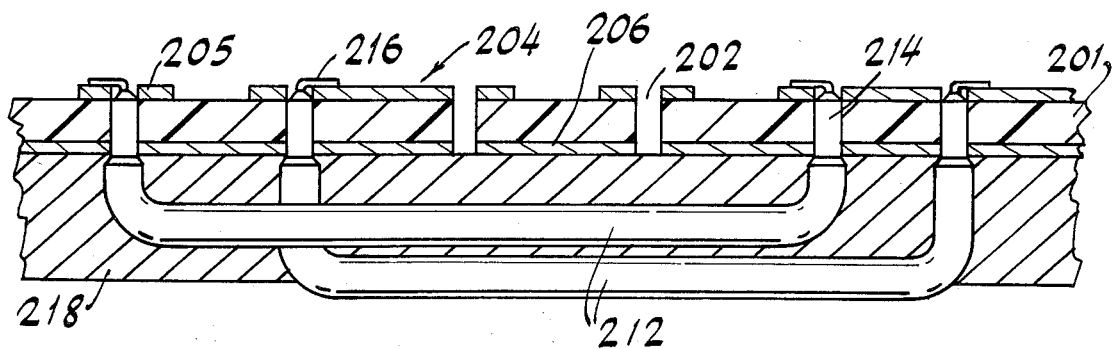

A variation of the process according to the invention is illustrated in FIGS. 2A-2C. The circuit board substrate 201 is provided with non-metallized poles 202 which are located to provide coaxial conductor termination points or component lead connections. The upper side of the board, as viewed in FIG. 2, includes a surface conductor pattern 204 produced by conventional printed circuit techniques. The conductor pattern includes conductive areas or lands 205 adjacent or surrounding the holes. The lower side of the board is copper coated to provide a ground plane 206.

The coaxial conductors 210 are cut to length and step-stripped at both ends as shown in FIG. 2A. Thus, shield 212 is removed from each end of the coaxial conductor to expose a bare insulation section 214 and the insulation is removed to expose a bare signal conductor section 216. The coaxial conductors are precut to lengths according to the distance to be spanned and according to the desired transmission line characteristics.

The ends of the prepared coaxial conductors are then inserted in the appropriate holes as shown in FIG. 2B. This can be done manually or semi-automatically using equipment for appropriately locating the coaxial conductor ends and inserting them into the holes. The bare insulation section approximately corresponds in length to the thickness of the substrate and, thus, fills the hole when the coaxial conductor is in place. The signal conductor ends 216 emerging above the board are bent over to make mechanical contact with the appropriate surface conductor areas 205. The signal conductors may then be soldered or welded in place.

The loose coaxial conductors on the lower side of the board are then dressed down to lay flat on the board surface. The board is then coated with a conductive layer 218 which interconnects the shields of the various coaxial conductors and connects to the ground plane. The conductive coating may be either an epoxy filled conductive resin or may be a plated copper surface. Where desired, a non-conductive surface lamination may thereafter be applied.

Figure 3A:
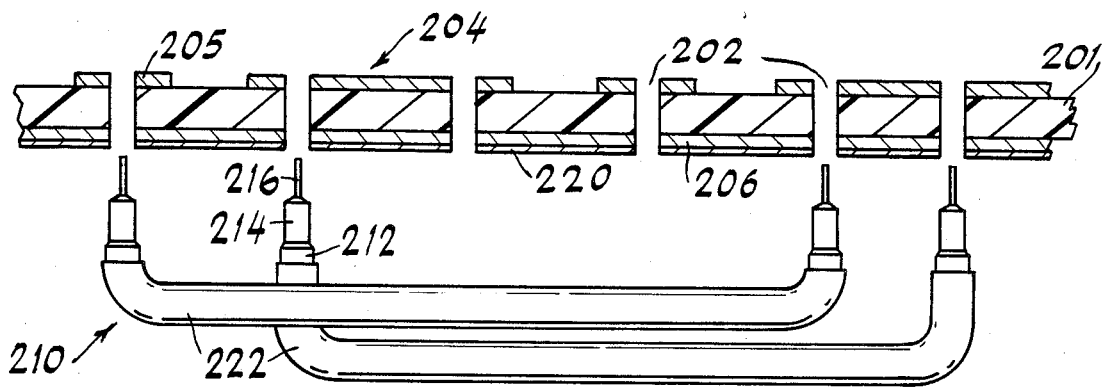
FIGS. 3A through 3C illustrate another variation of the process.
Figure 3B:
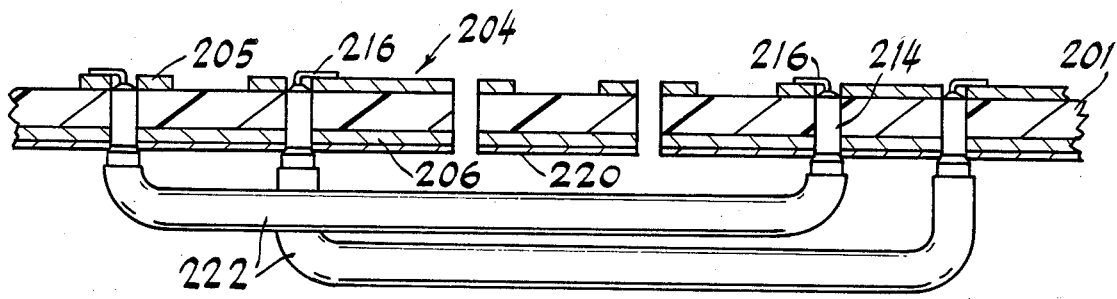
Figure 3C:
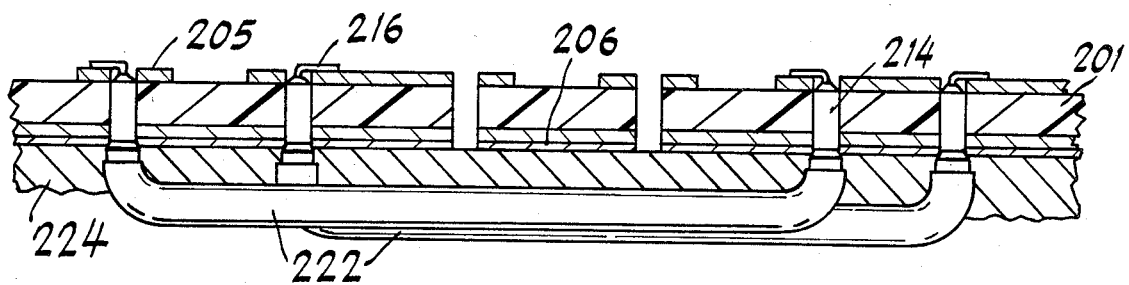

Another variation according to the invention is illustrated in FIGS. 3A-3C. In this variation the lower surface of the substrate is provided with a solder coating 220. Also, the coaxial conductors are provided with a solder coating 222 surrounding the shield.

The coaxial conductors are inserted as shown in FIG. 3B and the signal conductor ends connected in a manner similar to that previously described in connection with FIG. 2B.

When the coaxial conductors are in place they are dressed down to lay flat on the board surface. The board is then heated to reflow the solder on the coaxial conductors and on the board surface. If necessary, additional solder may be added during the solder reflow process. When completed, all of the coaxial conductor shields are interconnected by means of the solder coating 224.

The invention is more particularly defined in the appended claims.

I claim:

1. A method of making a coaxial conductor interconnection board having a plurality of coaxial conductors, each conductor of said plurality of coaxial conductors including a signal conductor surrounded by a dielectric in turn surrounded by a conductive shield, comprising the steps of:

drilling holes through the substrate of the board at selected terminal points;

placing a plurality of preformed coaxial conductors on one surface of the substrate;

stripping the end of each conductor of said plurality of preformed coaxial conductors to provide exposed signal conductor sections and exposed dielectric sections;

inserting the stripped ends of the coaxial conductors through said holes at the terminal points so that the exposed dielectric sections substantially reside in said holes, the conductive shields are on one side of the board, and the exposed signal conductor sections are on the other side of the board, and scribing the coaxial conductors on one surface of the substrate by placing an adhesive coating on the substrate and activating the adhesive upon contact with each coaxial conductor being scribed.

2. A method of making a coaxial conductor interconnection board having a plurality of coaxial conductors, each conductor of said plurality of coaxial conductors including a signal conductor surrounded by a dielectric in turn surrounded by a conductive shield, comprising the steps of:

precoating said plurality of coaxial conductors with adhesive;

drilling holes through the substrate of the board at selected terminal points;

placing the plurality of the precoated coaxial conductors on one surface of the substrate;

stripping the end of each conductor of said plurality of precoated coaxial conductors to provide exposed signal conductor sections and exposed dielectric sections;

inserting the stripped ends of the coaxial conductors through said holes at the terminal points so that the exposed dielectric sections substantially reside in said holes, the conductive shields are on one side of the board, and the exposed signal conductor sections are on the other side of the board, and scribing the coaxial conductors on one surface of the substrate by activating said adhesive upon contact with the substrate.

3. A method of making a coaxial conductor interconnection board having a plurality of coaxial conductors, each conductor of said plurality of coaxial conductors including a signal conductor surrounded by a dielectric in turn surrounded by a conductive shield, comprising the steps of:

drilling holes through the substrate of the board at selected terminal points;

placing a plurality of preformed coaxial conductors on one surface of the substrate;

stripping the end of each conductor of said plurality of preformed coaxial conductors to provide exposed signal conductor sections and exposed dielectric sections;

inserting the stripped ends of the coaxial conductors through said holes at the terminal points so that the exposed dielectric sections substantially reside in said holes, the conductive shields are on one side of the board, and the exposed signal conductor sections are on the other side of the board, and coating the circuit board with a conductive material to interconnect said conductive shields.

4. The method according to claim 3 wherein said coating is a plated copper coating.

5. The method according to claim 3 wherein the conductive material is a conductive resin coating.

6. The method according to claim 3 wherein the conductive material is solder.

7. The method according to claim 6 wherein each coaxial conductor of the plurality of coaxial conductors and one side of the substrate are coated with solder before the stripped ends are inserted into the holes and wherein the solder is formed into a conductive coating interconnecting each coaxial conductor shield by reflowing said solder after each coaxial conductor end has been inserted.

* * * * *